(12) United States Patent
Oguma et al.

(10) Patent No.: US 10,656,216 B2
(45) Date of Patent: May 19, 2020

(54) BATTERY STATE ESTIMATING APPARATUS

(71) Applicant: TOYOTA JIDOSHA KABUSHIKI KAISHA, Toyota-shi, Aichi-ken (JP)

(72) Inventors: Yasumasa Oguma, Tokyo-to (JP); Tetsuya Osaka, Tokyo (JP); Tokihiko Yokoshima, Tokyo (JP); Shingo Tsuda, Tokyo (JP); Kazuaki Utsumi, Tokyo (JP); Daikichi Mukoyama, Tokyo (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 109 days.

(21) Appl. No.: 15/903,351

(22) Filed: Feb. 23, 2018

(65) Prior Publication Data

US 2018/0259587 A1 Sep. 13, 2018

(30) Foreign Application Priority Data

Mar. 10, 2017 (JP) .................................. 2017-046098

(51) Int. Cl.
| | |
|---|---|
| *G01R 31/392* | (2019.01) |
| *H02J 7/00* | (2006.01) |
| *H02J 7/14* | (2006.01) |
| *G01R 31/387* | (2019.01) |

(Continued)

(52) U.S. Cl.
CPC ......... *G01R 31/392* (2019.01); *G01R 31/374* (2019.01); *G01R 31/387* (2019.01); *G01R 31/388* (2019.01); *H02J 7/0091* (2013.01); *H02J 7/14* (2013.01)

(58) Field of Classification Search
CPC .......... G01R 31/387; H02J 7/14; H02J 7/0091
See application file for complete search history.

(56) References Cited

U.S. PATENT DOCUMENTS

| | | |
|---|---|---|
| 2008/0136378 A1 | 6/2008 | Iwahana et al. |
| 2009/0243548 A1 | 10/2009 | Hoff |

(Continued)

FOREIGN PATENT DOCUMENTS

| | | |
|---|---|---|
| CN | 102918411 A | 2/2013 |
| JP | H10225004 A | 8/1998 |

(Continued)

*Primary Examiner* — Alvaro E Fortich
(74) *Attorney, Agent, or Firm* — Dickinson Wright PLLC

(57) ABSTRACT

A battery state estimating apparatus is provided with; a voltage detector configured to detect a voltage between a positive electrode and a negative electrode of a battery; an impedance detector configured to detect an impedance of the battery; a first estimator configured to estimate a first temporary value of a charge amount of the battery; a second estimator configured to estimate a second temporary value of the charge amount of the battery; and a determinator configured (i) to determine that the first temporary value is the charge amount of the battery if the first temporary value or the second temporary value is out of a predetermined range, and (ii) to determine that the second temporary value, or a corrected value of the first temporary value is the charge amount of the battery if the first temporary value or the second temporary value is within the predetermined range.

6 Claims, 16 Drawing Sheets

(51) Int. Cl.
*G01R 31/374* (2019.01)
*G01R 31/388* (2019.01)

(56) References Cited

U.S. PATENT DOCUMENTS

| | | | | |
|---|---|---|---|---|
| 2012/0169288 A1* | 7/2012 | Ueki | ............ | H01M 2/20 |
| | | | | 320/134 |
| 2013/0027047 A1* | 1/2013 | Yoshioka | ............ | G01R 31/389 |
| | | | | 324/426 |
| 2014/0232411 A1* | 8/2014 | Vaidya | ............ | G01R 31/3648 |
| | | | | 324/426 |
| 2015/0025822 A1* | 1/2015 | Ladret | ............ | G01R 31/374 |
| | | | | 702/63 |
| 2015/0048838 A1* | 2/2015 | Ose | ............ | G01R 31/3648 |
| | | | | 324/430 |
| 2016/0069964 A1* | 3/2016 | Takahashi | ............ | H01M 10/48 |
| | | | | 324/433 |

FOREIGN PATENT DOCUMENTS

| | | | |
|---|---|---|---|
| JP | 2000-311721 A | 11/2000 | |
| JP | 2011-520408 A | 7/2011 | |
| JP | 2012-8134 A | 1/2012 | |
| JP | 2014166015 A | 9/2014 | |
| WO | 2013114669 A1 | 8/2013 | |

* cited by examiner

BATTERY STATE ESTIMATING APPARATUS

CROSS-REFERENCE TO RELATED APPLICATIONS

This application is based upon and claims the benefit of priority of the prior Japanese Patent Application No. 2017-046098, filed on Mar. 10, 2017, the entire contents of which are incorporated herein by reference.

BACKGROUND

1. Technical Field

Embodiments of the present disclosure relate to a battery state estimating apparatus configured to estimate a state of a battery mounted on a vehicle or the like.

2. Description of the Related Art

For this type of apparatus, there is known an apparatus configured to estimate a charge amount of a battery (e.g., a state of charge (SOC)) by monitoring a voltage of the battery. For example, Japanese Patent Application Laid Open No. 2000-311721 discloses an apparatus configured to determine that the battery is fully charged on the basis of a change amount of the voltage per unit charge amount. Japanese Patent Application Laid Open No. 2011-520408 discloses an apparatus configured to stop a charge control for the battery when a ratio between a rate of change in the voltage and a rate of change in the charge amount reaches a predetermined value.

Japanese Patent Application Laid Open No. 2012-008134 discloses an apparatus configured to correct a measurement value of the voltage in accordance with an internal impedance of the battery and to estimate the charge amount of the battery on the basis of the corrected value, in order to improve an estimation accuracy of the charge amount estimated by the voltage.

In a battery including a plurality of electrode bodies, there may be variations in temperature and a deterioration state for each electrode body. In a state in which there are the variations, there may be an unintended discrepancy between the charge amount estimated from the voltage and an actual charge amount. This may cause, for example, overcharge in controlling the charge amount of the battery.

Regarding the variations for each electrode body, an influence is possibly reduced by separately detecting the voltages of the electrode bodies; however, in that case, it is required to provide each electrode body with a terminal for detecting the voltage, and an apparatus configuration is complicated, which is technically problematic.

SUMMARY

In view of the aforementioned problems, it is therefore an object of embodiments of the present disclosure to provide a battery state estimating apparatus configured to estimate the charge amount of the battery including the plurality of electrode bodies.

The above object of embodiments of the present disclosure can be achieved by a battery state estimating apparatus is provide with a voltage detector configured to detect a voltage between a positive electrode and a negative electrode of a battery having a plurality of electrode bodies, which are connected in series; an impedance detector configured to detect an impedance of the battery; a first estimator configured to estimate a first temporary value of a charge amount of the battery on the basis of the voltage of the battery detected by said voltage detector; a second estimator configured to estimate a second temporary value of the charge amount of the battery on the basis of the impedance of the battery detected by said impedance detector; and a determinator configured (i) to determine that the first temporary value is the charge amount of the battery if the first temporary value or the second temporary value is out of a predetermined range, and (ii) to determine that the second temporary value, or a corrected value of the first temporary value, which is corrected by using the second temporary value, is the charge amount of the battery if the first temporary value or the second temporary value is within the predetermined range.

According to the battery state estimating apparatus in embodiments of the present disclosure, the first temporary value, which is a temporary value of the charge amount (e.g., SOC) of the battery, is estimated on the basis of the voltage between the positive electrode and the negative electrode of the battery. If, however, the battery includes the plurality of electrode bodies, there may be variations in temperature and a deterioration state for each electrode body. This may cause an unintended discrepancy between the charge amount estimated from the voltage and an actual charge amount.

Thus, in the battery state estimating apparatus according to embodiments of the present disclosure, in addition to the first temporary value estimated on the basis of the voltage of the battery, the second temporary value, which is another temporary value, is estimated on the basis of the impedance of the battery. In particular, if the first temporary value or the second temporary value is within the predetermined range, the second temporary value, or the corrected value of the first temporary value, which is corrected by using the second temporary value, is determined to be the charge amount of the battery. The "predetermined range" may be set in advance as a range of the charge amount that is suitable to estimate the charge amount from the impedance of the battery, and may be set as, e.g., a range in which a rate of change in the impedance with respect to the charge amount of the battery is greater than that in a normal case.

According to studies of the present inventors, it has been found that the charge amount of the battery can be accurately estimated even if there are variations among the plurality of electrode bodies, if the charge amount can be estimated by using a parameter that significantly changes with respect to the charge amount of the battery. Thus, the second temporary value, or the corrected value of the first temporary value, which is corrected by using the second temporary value, is adopted as the charge amount of the battery if the first temporary value or the second temporary value is within the predetermined range, by which the charge amount of the battery can be estimated with high accuracy.

On the other hand, if the first temporary value or the second temporary value is out of the predetermined range, the first temporary value is determined to be the charge amount of the battery. When the charge amount is estimated by using the voltage of the battery, the estimation can be performed in a shorter time than that when the charge amount is estimated by using the impedance. Thus, if the first or second temporary value is out of the predetermined range, the charge amount can be estimated by adopting the first temporary value estimated from the voltage of the battery. In other words, only the first temporary value, which is estimated from the voltage of the battery, is adopted for the estimation of the charge amount of the battery when the first or second temporary value is out of the predetermined range, which is the range of the charge amount that is suited to estimate the charge amount from the impedance of the battery, and the second temporary value, which is estimated from the impedance of the battery, is reflected only when the first or second temporary value is in the predetermined range. This makes it possible to estimate the charge amount of the battery, quickly and accurately, even in comparison with an aspect in which the charge amount is estimated always from the impedance and the voltage.

In one aspect of the battery state estimating apparatus according to embodiments of the present disclosure, the predetermined range is a range in which a rate of change in the impedance of the battery with respect to the charge amount of the battery is greater than or equal to a predetermined value, or is a range in which a change tendency of the impedance of the battery is a predetermined.

According to this aspect, in the range in which the rate of change in the impedance of the battery with respect to the charge amount of the battery is greater than or equal to the predetermined value, or in the range in which the change tendency of the impedance of the battery is the predetermined tendency, it is determined that the second temporary value estimated on the basis of the impedance of the battery, or the corrected value obtained by using the second temporary value, is the charge amount of the battery. The "predetermined value" herein is set in advance as a threshold value for determining that the rate of change in the impedance with respect to the charge amount of the battery is greater than that in the normal case (i.e. when a diffusion resistance has a relatively small change of rate), for example, due to an increase in the rate of change in the diffusion resistance. Moreover, the "predetermined tendency" corresponds to a situation in which the change tendency of the impedance changes characteristically in accordance with the charge amount of the battery (e.g., a situation in which the impedance that is increasing changes to decrease). It is thus possible to estimate the charge amount of the battery with high accuracy by using the impedance of the battery.

In another aspect of the battery state estimating apparatus according to embodiments of the present disclosure, second estimator is configured to estimate the second temporary value only if the first temporary value is within the predetermined range.

According to this aspect, the second temporary value is estimated only if the first temporary value is within the predetermined range, and the second temporary value is not estimated (in other words, only the first temporary value is estimated) if the first temporary value is out of the predetermined range. It is thus possible to reduce an unexecutable process of the apparatus, in comparison with when both of the first temporary value and the second temporary value are always estimated, and it is possible to estimate the charge amount of the battery, accurately and quickly, in accordance with circumstances.

In another aspect of the battery state estimating apparatus according to embodiments of the present disclosure, the predetermined range is a range including a charge amount at which the battery is determined to be fully charged or fully discharged.

According to this aspect, the charge amount when the battery is nearly fully charged or fully discharged can be estimated with high accuracy. It is thus possible to prevent the overcharge or over-discharge of the battery.

In another aspect of the battery state estimating apparatus according to embodiments of the present disclosure, the battery state estimating apparatus, further comprising: a charger configured to perform a charge control of the battery; a first controller programmed to control said charger to stop the charge control if the charge amount of the battery determined by said determinator is a charge amount at which the battery is determined to be fully charged, during the charge control.

According to this aspect, the charge control is stopped when the battery is fully charged. It is thus possible to certainly prevent the overcharge of the battery.

In another aspect of the battery state estimating apparatus according to embodiments of the present disclosure, the battery state estimating apparatus, further comprising: a discharger configured to perform a discharge control of the battery; a second controller programmed to control said discharger to stop the discharge control if the charge amount of the battery determined by said determinator is a charge amount at which the battery is determined to be fully discharged, during the charge control.

According to this aspect, the discharge control is stopped when the battery is fully discharged. It is thus possible to certainly prevent the over-discharge of the battery.

The nature, utility, and further features of this disclosure will be more clearly apparent from the following detailed description with reference to embodiments of the disclosure when read in conjunction with the accompanying drawings briefly described below.

DETAILED DESCRIPTION OF THE EMBODIMENTS

A battery state estimating apparatus according to embodiments of the present disclosure will be explained with reference to the drawings. The following is an example in which the battery state estimating apparatus is configured to estimate a battery state associated with a battery of a vehicle.

First Embodiment

A battery state estimating apparatus according to a first embodiment will be explained with reference to FIG. 1 to FIG. 15.

Configuration of Apparatus

Figure 1:
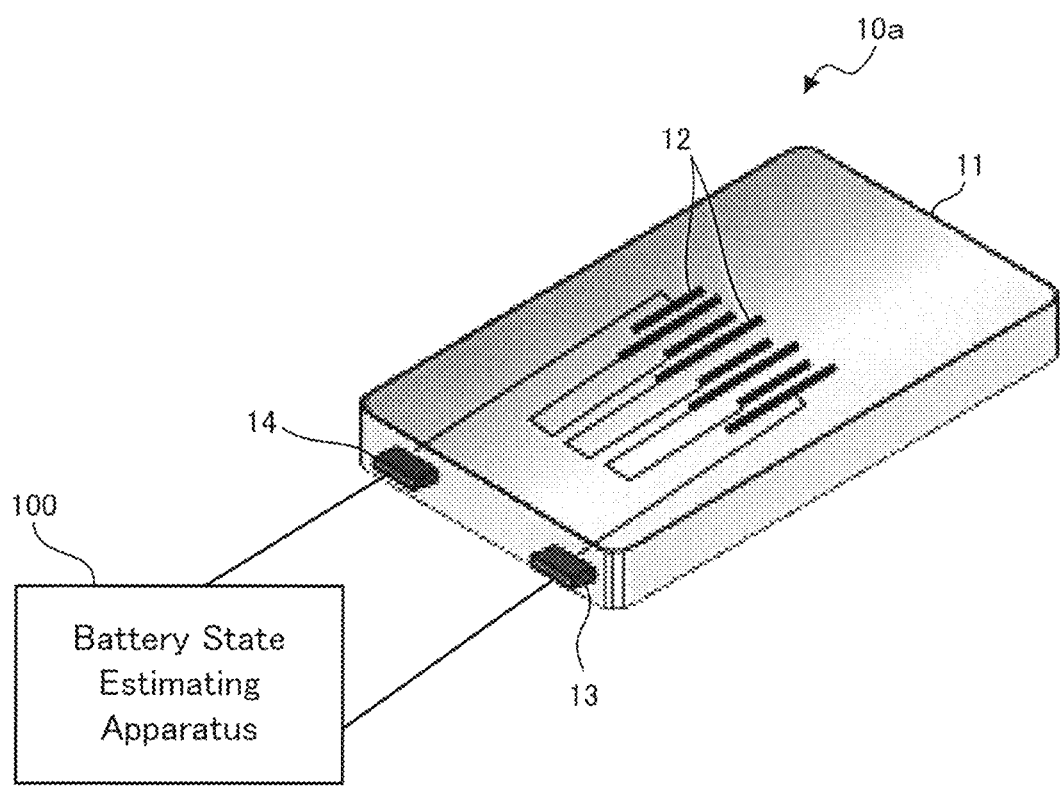
FIG. 1 is a perspective view illustrating an example of a battery having a plurality of electrodes, which are connected in series in a cell.
Figure 2:
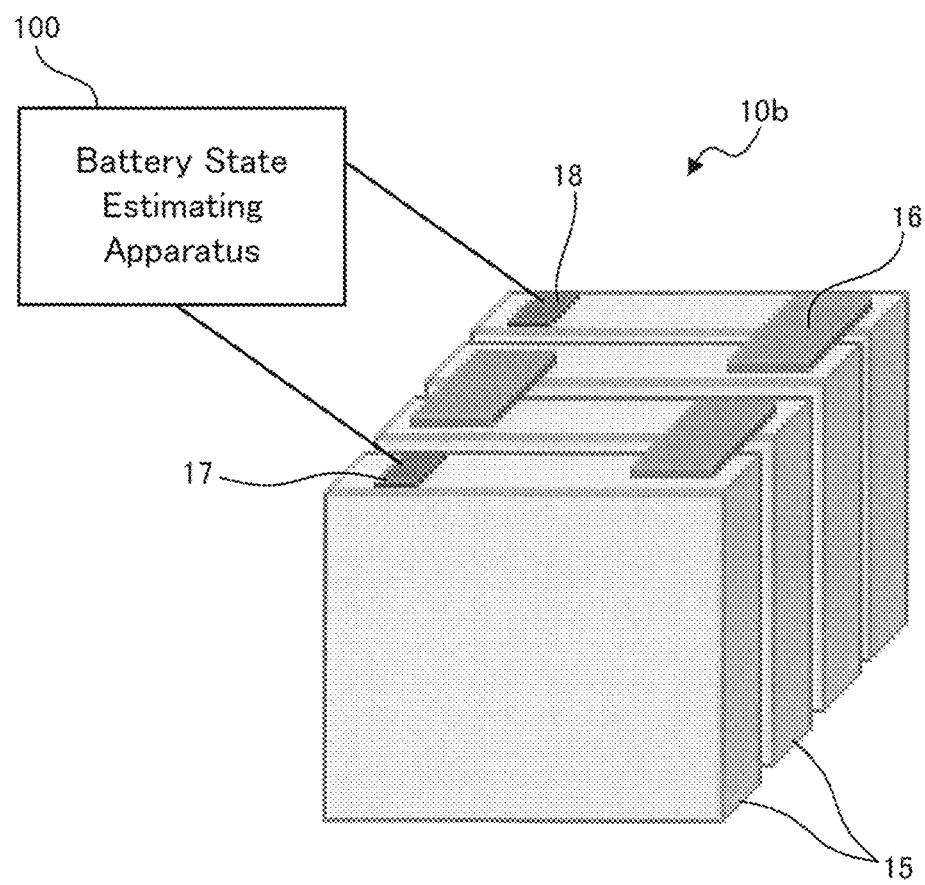
FIG. 2 is a perspective view illustrating an example of a battery having a plurality of cells, which are connected by an external terminal.

Firstly, a configuration of a battery 10 whose battery state is estimated by a battery state estimating apparatus 100 according to the first embodiment will be explained with reference to FIG. 1 and FIG. 2. FIG. 1 is a perspective view illustrating an example of the battery 10 having a plurality of electrodes, which are connected in series in a cell. FIG. 2 is a perspective view illustrating an example of the battery 10 having a plurality of cells, which are connected by an external terminal.

As illustrated in FIG. 1 and FIG. 2, the battery according to the first embodiment is a specific example of the "battery" and is configured to include a plurality of electrode bodies. For example, a battery 10a illustrated in FIG. 1 has a plurality of electrode bodes 12, which are connected in series in a cell 11. Out of the plurality of electrode bodes 12, each of the electrode bodies 12 that are located on both ends are connected to a respective one of a positive terminal 13 and a negative terminal 14. The battery 10a is connected to the battery state estimating apparatus 100 via the positive terminal 13 and the negative terminal 14. Moreover, a battery 10b illustrated in FIG. 2 has a plurality of cells 15 as electrode bodies, which are connected to each other by a bus bar 16 as an external terminal. Each of the cells 15 that are located on both ends is provided with a respective one of a positive terminal 17 and a negative terminal 18. The battery 10b is connected to the battery state estimating apparatus 100 via the positive terminal 17 and the negative terminal 18.

The battery 10 exemplified herein is merely an example, and may have, e.g., a bipolar structure. The battery 10 having the plurality of electrode bodies can obtain the technical effect of the battery state estimating apparatus 100 according to the first embodiment described later.

Configuration of Battery State Estimating Apparatus

Figure 3:
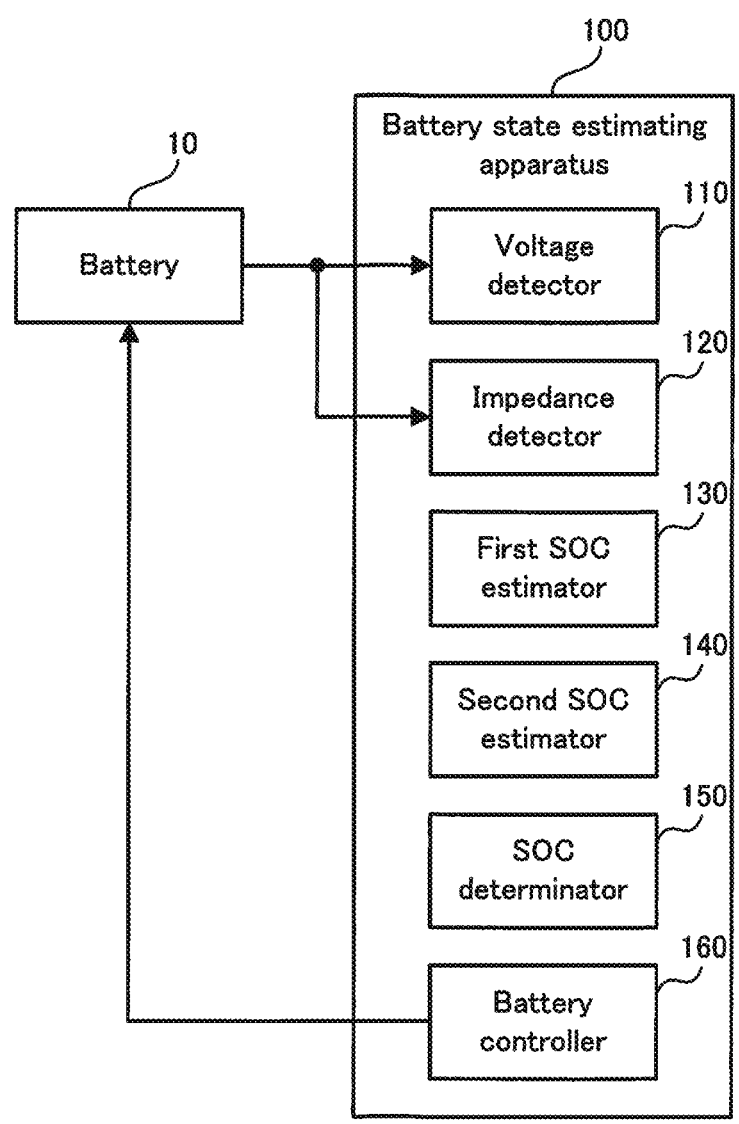
FIG. 3 is a block diagram illustrating a configuration of a battery state estimating apparatus according to a first embodiment.

Next, a configuration of the battery state estimating apparatus 100 according to the first embodiment will be explained with reference to FIG. 3. FIG. 3 is a block diagram illustrating the configuration of the battery state estimating apparatus 100 according to the first embodiment.

As illustrated in FIG. 3, the battery state estimating apparatus 100 according to the first embodiment is an electronic unit electrically connected to the battery 10 of a vehicle, and is configured to estimate a SOC, which is a battery state of the battery 10. The battery state estimating apparatus 100 is provided with a voltage detector 110, an impedance detector 120, a first SOC estimator 130, a second SOC estimator 140, a SOC determinator 150, and a battery controller 160, as logical or physical processing blocks realized therein.

The voltage detector 110 is a specific example of the "voltage detector", and is configured to detect an open circuit voltage (OCV) of the battery 10. Information about the open circuit voltage (hereinafter simply referred to as a "voltage") of the battery 10 detected by the voltage detector 110 is configured to be outputted to the first SOC estimator 130.

The impedance detector 120 is a specific example of the "impedance detector", and is configured to detect the impedance of the battery 10. Information about the impedance of the battery 10 detected by the impedance detector 120 is configured to be outputted to the second SOC estimator 140.

The first SOC estimator 130 is a specific example of the "first estimator", and is configured to estimate the SOC of the battery 10 on the basis of the voltage of the battery 10 detected by the voltage detector 110. The first SOC estimator 130 is configured to estimate the SOC of the battery 10, for example, by using a map indicating a relation between the voltage and the SOC of the battery 10, or the like. The relation between the voltage and the SOC of the battery 10 can be determined by a previous simulation or the like.

The second SOC estimator 140 is a specific example of the "second estimator", and is configured to estimate the SOC of the battery 10 on the basis of the impedance of the battery 10 detected by the impedance detector 120. The second SOC estimator 140 is configured to estimate the SOC of the battery 10, for example, by using a map indicating a relation between the impedance and the SOC of the battery 10, or the like. The relation between the impedance and the SOC of the battery 10 can be determined by a previous simulation or the like.

The SOC determinator 150 is a specific example of the "determinator", and is configured to determine whether or not the SOCs estimated by the first SOC estimator 130 and the second SOC estimator 140 satisfy predetermined conditions. A determination process performed by the SOC determinator 150 will be detailed later in Explanation of Operation.

The battery controller 160 is configured or programmed to perform a charge control of the battery 10, on the basis of a determination result of the SOC determinator 150. The battery controller 160 may be configured or programmed to perform a discharge control, other than the charge control of the battery 10. The battery controller 160 is a specific example of the "charger", the "discharger", the "first controller", and the "second controller".

Explanation of Operation

Figure 4:
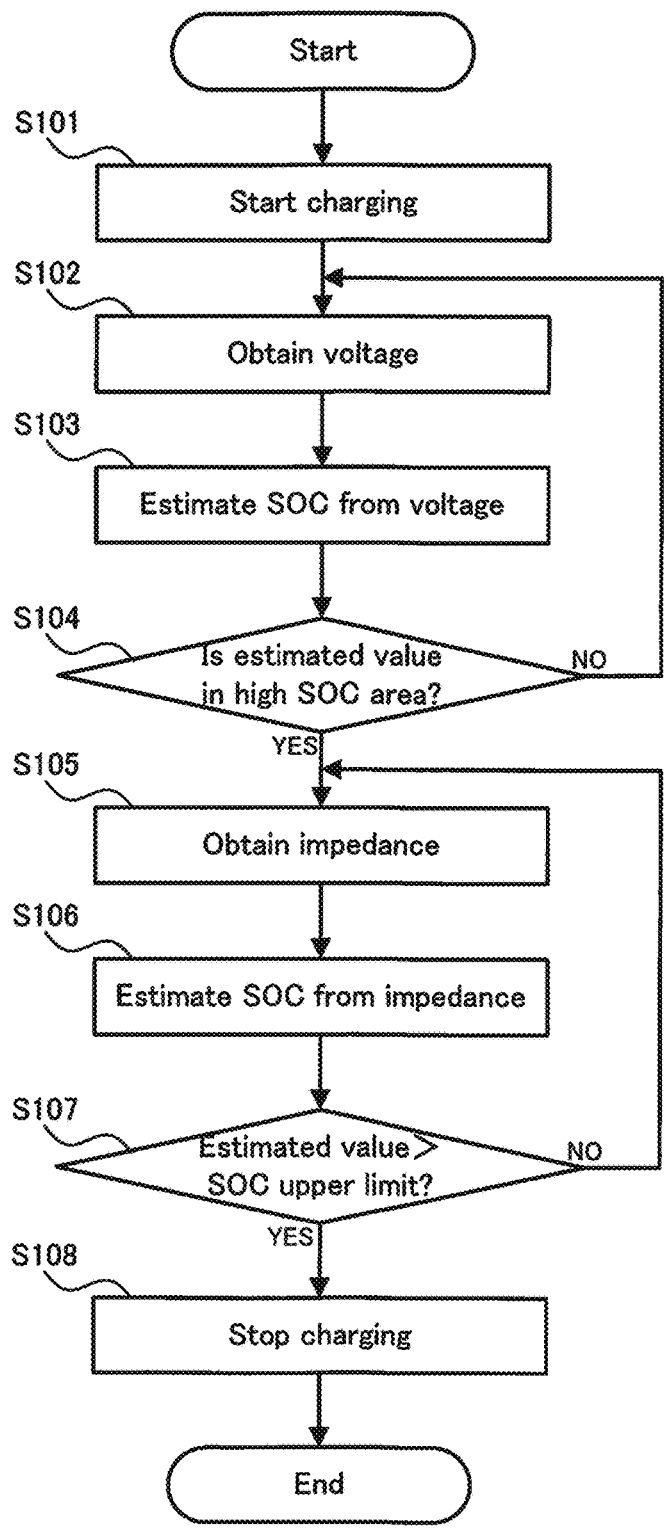
FIG. 4 is a flowchart illustrating a flow of operation of the battery state estimating apparatus according to the first embodiment.

Next, the operation of the battery state estimating apparatus 100 according to the first embodiment will be explained with reference to FIG. 4. FIG. 4 is a flowchart illustrating a flow of the operation of the battery state estimating apparatus 100 according to the first embodiment.

As illustrated in FIG. 4, in operation of the battery state estimating apparatus 100 according to the first embodiment, if the charging of the battery 10 is started (step S101), the voltage detector 110 obtains the voltage of the battery 10 (step S102). Then, the first SOC estimator 130 estimates the SOC on the basis of the voltage of the battery 10 (step S103).

If the SOC is estimated from the voltage of the battery 10, the SOC determinator 150 determines whether or not an estimated value of the SOC is in a high SOC area (step S104). The high SOC area is a specific example of the "predetermined range", and is set as, e.g., a range of the SOC in which a rate of change with respect to a SOC of a diffusion resistance in a positive electrode of the battery 10 is greater than or equal to a predetermined value (e.g., 85% to 100%). In particular, the high SOC area preferably includes an upper limit value of the SOC set in advance (e.g., a value corresponding to full charge). In the SOC area set in this manner, a rate of change in the impedance with respect to the SOC of the battery 10 is high.

If it is determined that the estimated value of the SOC is not in the high SOC area (the step S104: NO), the process is restarted from the step S102, and the estimation of the SOC based on the voltage of the battery 10 is continued. On the other hand, if it is determined that the estimated value of the SOC is in the high SOC area (the step S104: YES), the impedance detector 120 obtains the impedance of the battery 10 (step S105).

The second SOC estimator 140 then estimates the SOC on the basis of the impedance of the battery 10 (step S106). If the SOC is estimated from the impedance of the battery 10, the SOC determinator 150 determines whether or not an estimated value of the SOC exceeds the upper limit value of the SOC set in advance (e.g., the value corresponding to full charge) (step S107).

If it is determined that the estimated value of the SOC does not exceed the upper limit value (the step S107: NO), the process is restarted from the step S105, and the estimation of the SOC based on the impedance of the battery 10 is continued. On the other hand, if it is determined that the estimated value of the SOC exceeds the upper limit value (the step S107: YES), the battery controller 160 stops the charge control of the battery 10 (step S108).

As described above, in the battery state estimating apparatus according to the first embodiment, the process is performed from the start of the charging of the battery 10 to the end of the charging. For example, if a charge amount of the battery 10 is reduced after the end of the charging of the battery 10, the process may be restarted from the step 101.

Moreover, in the flow illustrated in FIG. 4, in a period in which the SOC is estimated on the basis of the impedance of the battery 10 (i.e., if the SOC is in the high SOC area), the estimation of the SOC based on the voltage of the battery 10 is not performed. The estimation of the SOC based on the voltage of the battery 10, however, may be performed in parallel with the estimation of the SOC based on the impedance of the battery 10. In other words, the estimation of the SOC based on the voltage of the battery 10 may be performed even in the high SOC area.

Effect of Embodiment

Figure 5:
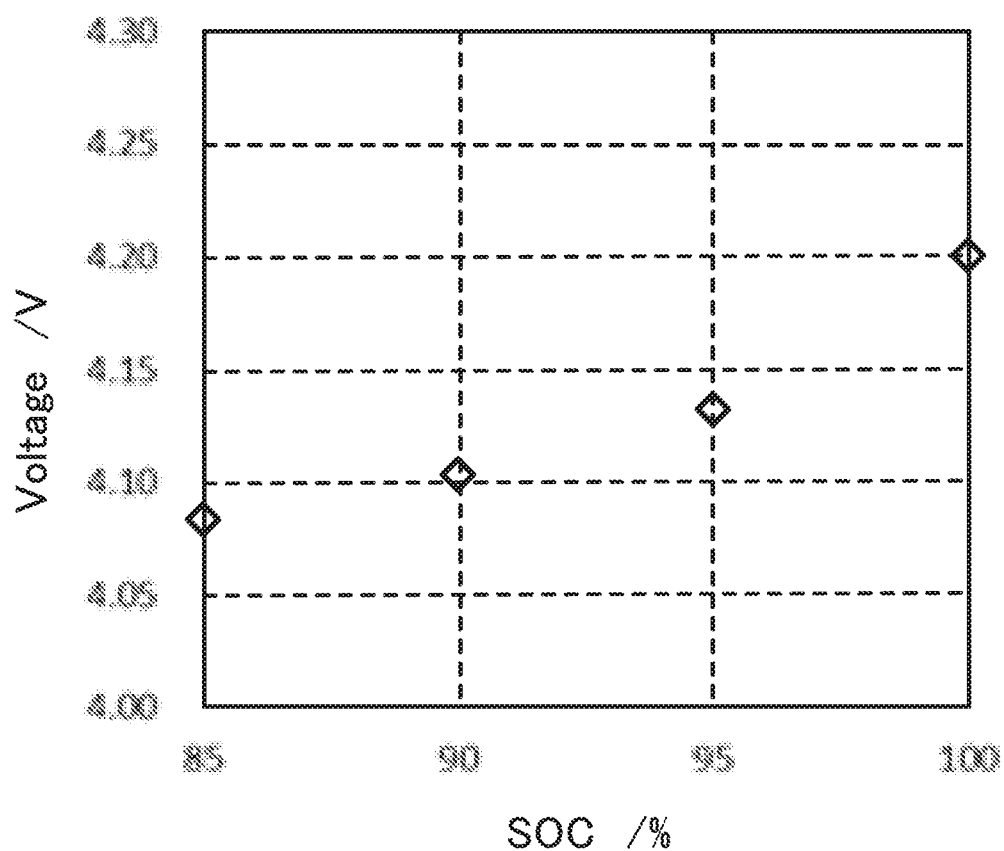
FIG. 5 is a graph illustrating the voltage of the battery in a high SOC area.
Figure 6:
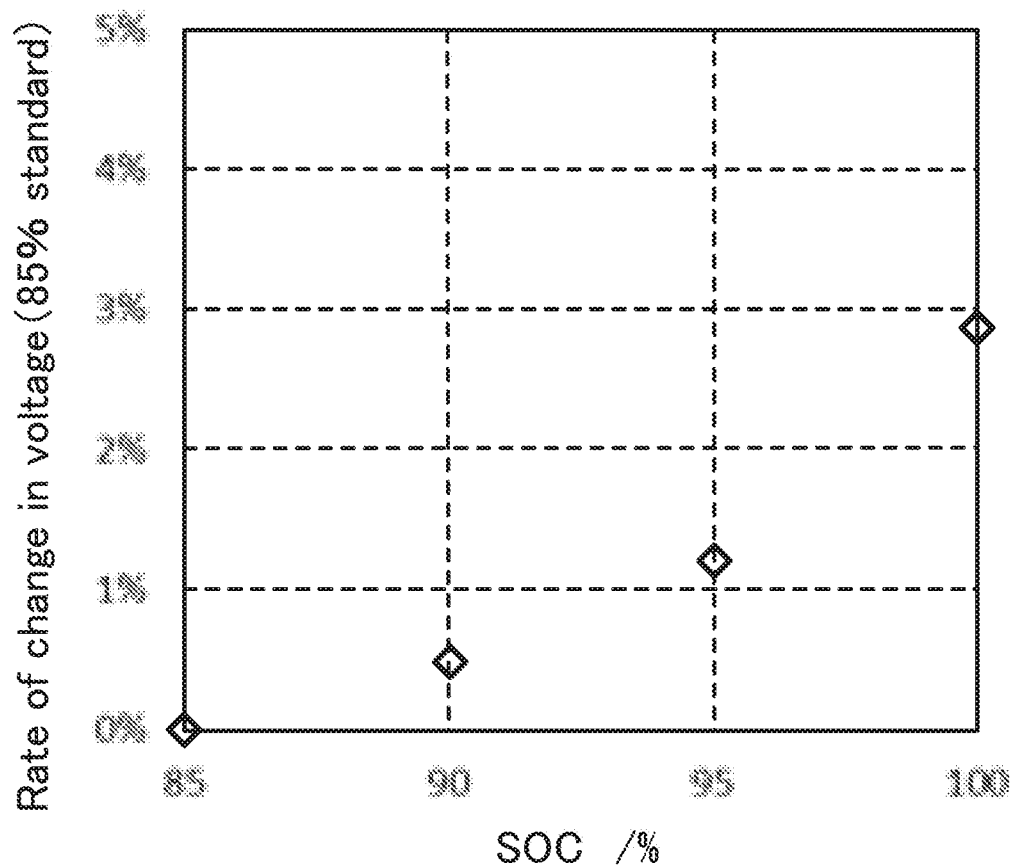
FIG. 6 is a graph illustrating a rate of change in the voltage of the battery in the high SOC area.
Figure 7:
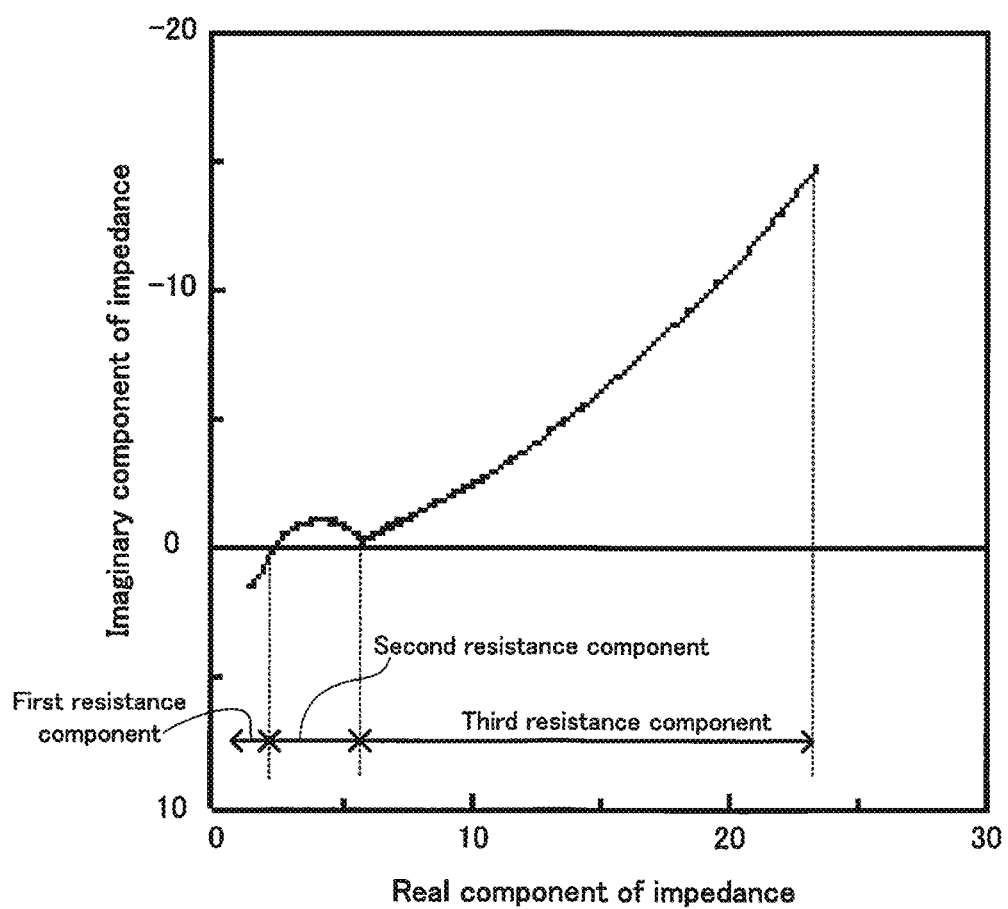
FIG. 7 is a graph illustrating the complex impedance of the battery.
Figure 8:
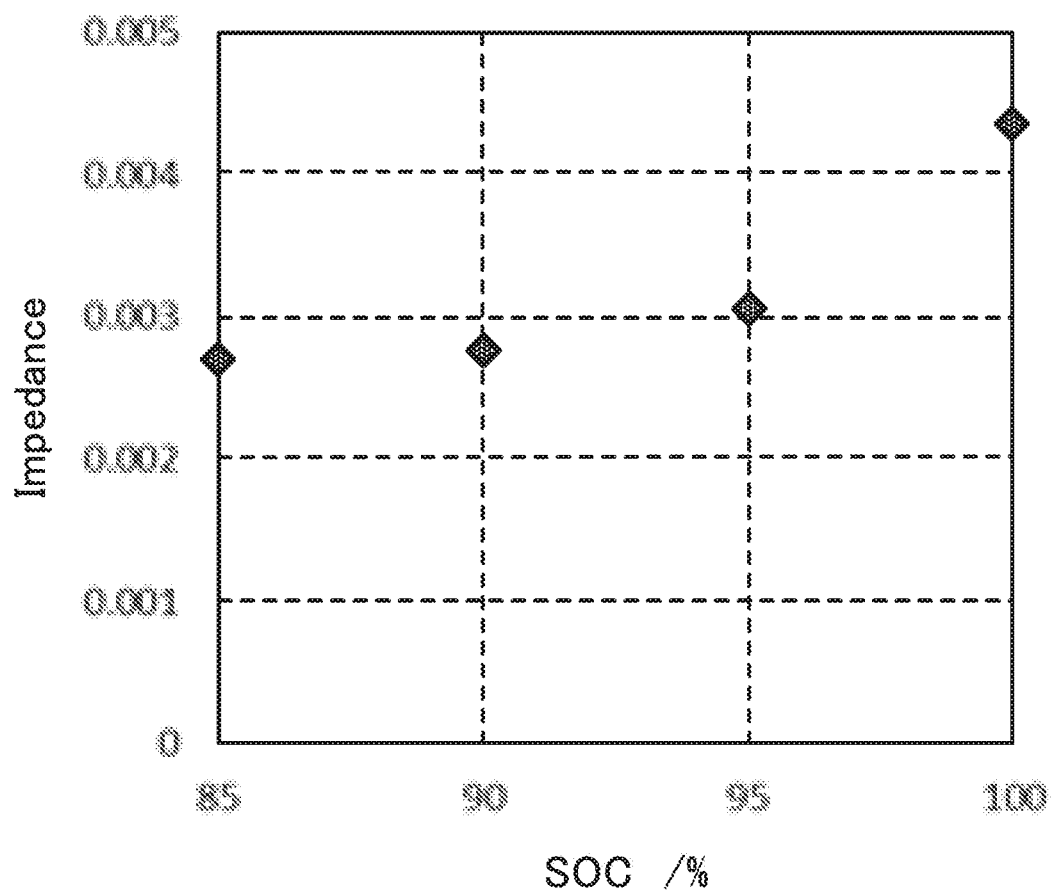
FIG. 8 is a graph illustrating the impedance of the battery in the high SOC area.
Figure 9:
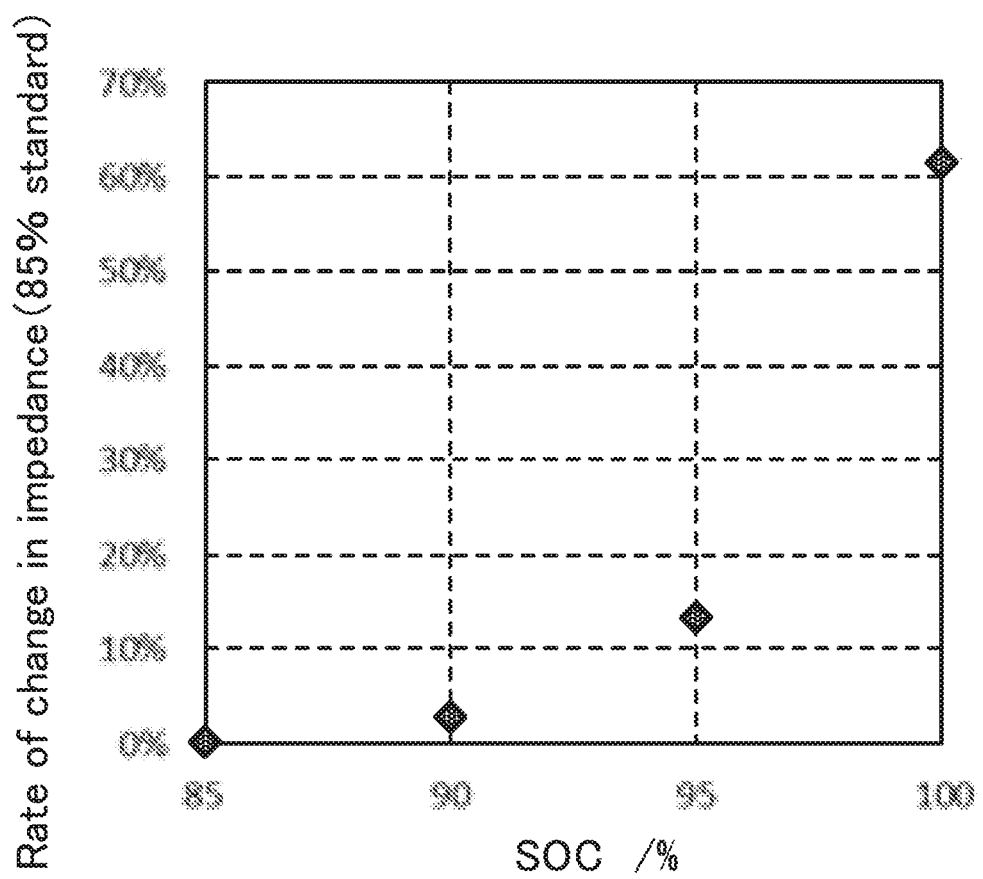
FIG. 9 is a graph illustrating a rate of change in the impedance of the battery in the high SOC area.

Next, the technical effect exhibited by the battery state estimating apparatus 100 according to the first embodiment will be explained with reference to FIG. 5 to FIG. 9. FIG. 5 is a graph illustrating the voltage of the battery 10 in the high SOC area. FIG. 6 is a graph illustrating a rate of change in the voltage of the battery 10 in the high SOC area. FIG. 7 is a graph illustrating the complex impedance of the battery 10. FIG. 8 is a graph illustrating the impedance of the battery 10 in the high SOC area. FIG. 9 is a graph illustrating a rate of change in the impedance of the battery 10 in the high SOC area.

The battery state estimating apparatus 100 according to the first embodiment is configured to estimate the SOC of the battery 10 including the plurality of electrode bodies as explained above (refer to FIG. 1, FIG. 2, etc.). In such a battery 10, there may be variations in temperature and a deterioration state for the electrode bodies. In a state in which there are the variations for the electrode bodies, there may be an unintended discrepancy between the SOC estimated from the voltage and an actual SOC.

If the estimated SOC is not accurate, the charge control of the battery 10 may not be appropriately performed. For example, it is not determined that the battery 10 is fully charged when it is supposed to be determined to be fully charged, and as a result, the battery 10 may be overcharged. In order to avoid such a detrimental effect, the battery state estimating apparatus 100 according to the first embodiment is configured to estimate the SOC on the basis of the impedance of the battery 10 if the battery 10 is in the high SOC area.

As illustrated in FIG. 5 and FIG. 6, if the battery is in the high SOC area (which is 85% to 100% here), it can be estimated that the SOC is higher as the battery 10 has a higher voltage. In the high SOC area, however, the rate of change in the voltage with respect to the SOC of the battery 10 is only several percentages.

As illustrated in FIG. 7, the impedance (or complex impedance) of the battery 10 has a first resistance component, a second resistance component, and a third resistance component. The second resistance component corresponds to an arc component of the complex impedance. The first resistance component is a linear component that is less than the arc component. The third resistance component is a linear component that is greater than the arc component. In the first embodiment, out of the three resistance components, a real component of the third resistance component may be used to estimate the SOC.

As illustrated in FIG. 8 and FIG. 9, if the battery 10 is in the high SOC area (which is 85% to 100% here), it can be estimated that the SOC is higher as the battery 10 has a higher impedance. Here, particularly in the high SOC area, while the SOC changes from 85% to 100%, the impedance of the battery 10 increases by 60% or more. This is extremely greater than the rate of change in the voltage of the battery 10 in the high SOC area (refer to FIG. 6).

According to the studies of the present inventors, it has been found that the SOC of the battery 10 can be accurately estimated even if there are variations in the plurality of electrode bodies, if the SOC can be estimated by using a parameter that significantly changes with respect to the SOC of the battery 10. Thus, if the impedance is used when the SOC of the battery 10 is in the high SOC area, the SOC of the battery 10 can be estimated with high accuracy.

On the other hand, the estimation of the SOC based on the voltage of the battery 10 requires a less time than the estimation of the SOC based on the impedance does. Therefore, in an area in which the rate of change in the impedance is low and in which the aforementioned technical effect is weak (i.e. in an area other than the high SOC area), the SOC can be estimated by using the voltage of the battery 10.

Modified Example

The aforementioned embodiment exemplifies that the impedance is used in the high SOC area. Even in an area in which the rate of change in the impedance with respect to the SOC of the battery is high, the SOC of the battery can be estimated by using the impedance.

Figure 10:
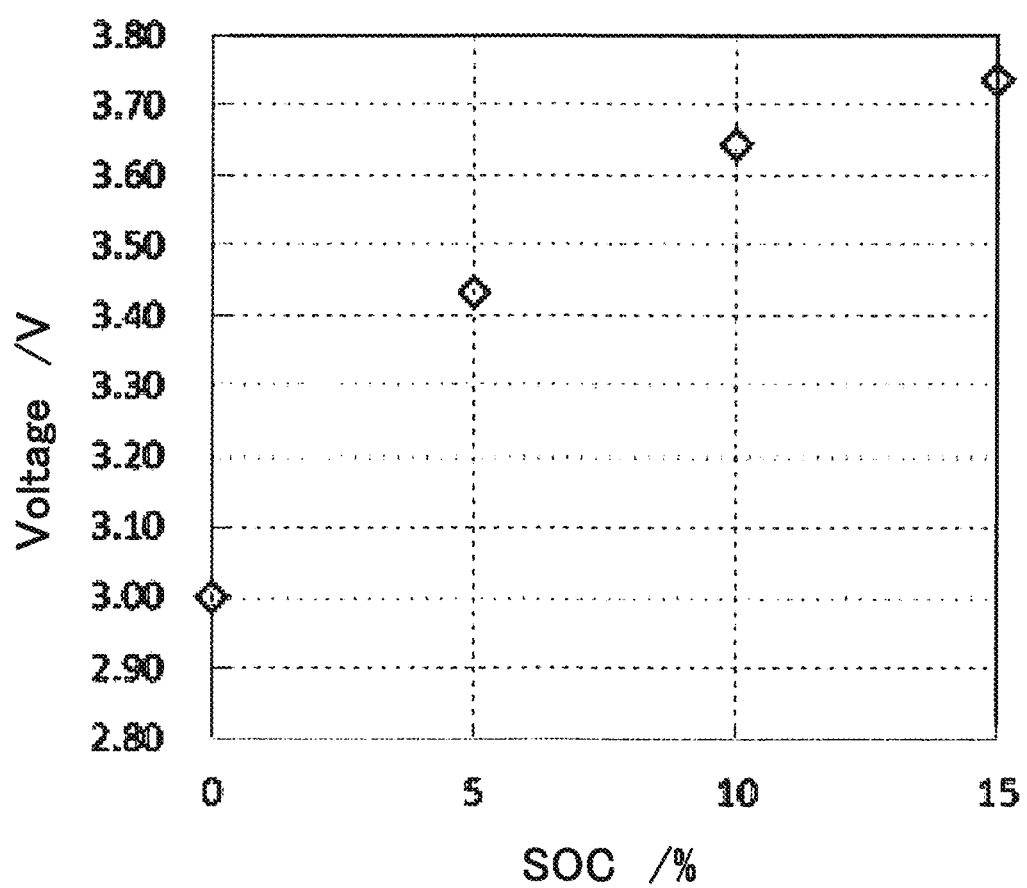
FIG. 10 is a graph illustrating the voltage of the battery in a low SOC area.
Figure 11:
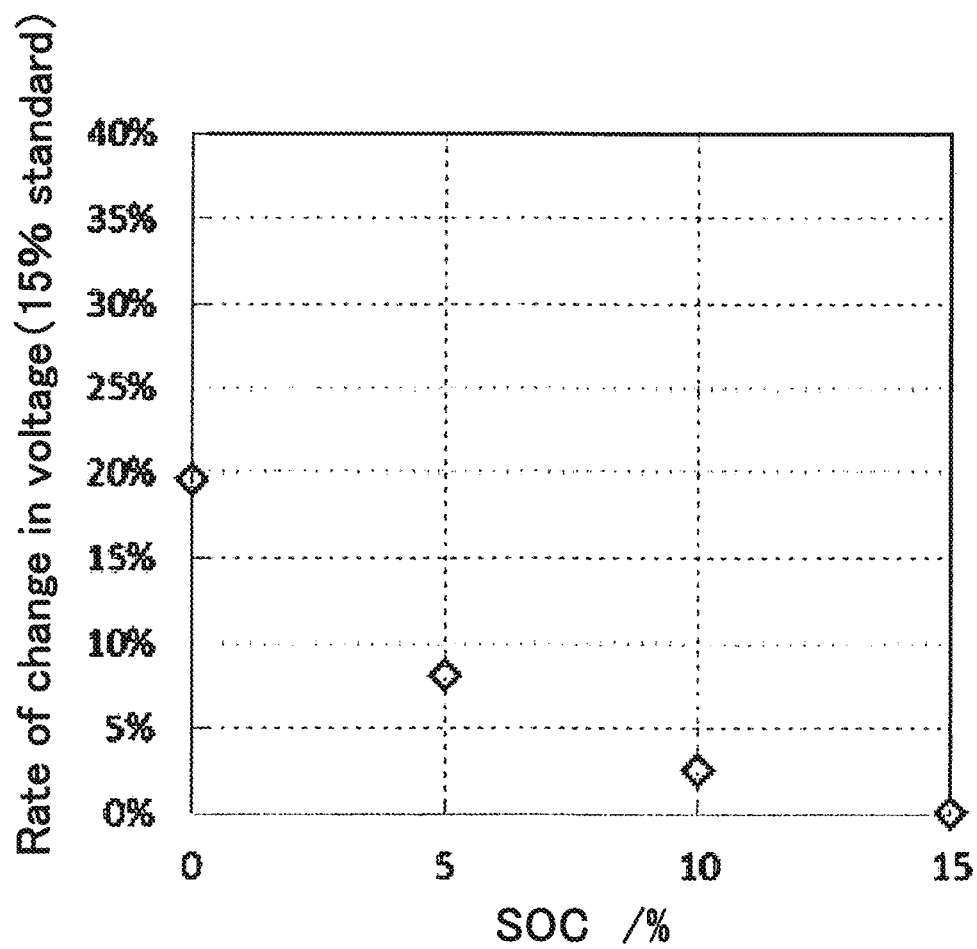
FIG. 11 is a graph illustrating a rate of change in the voltage of the battery in the low SOC area.
Figure 12:
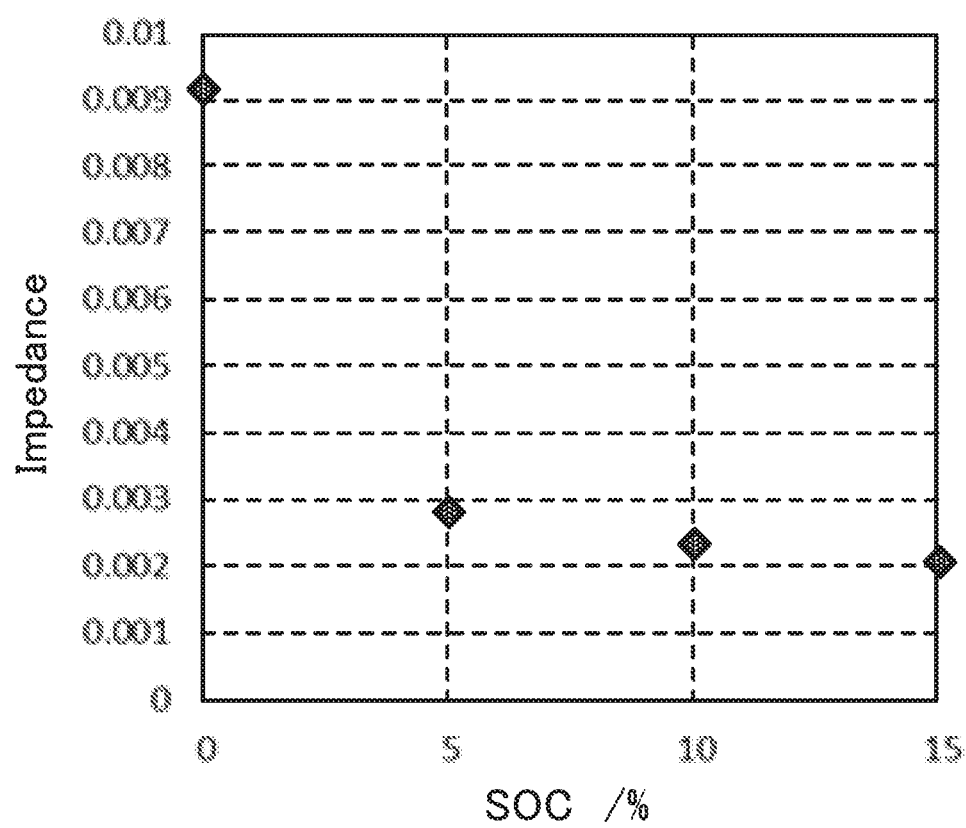
FIG. 12 is a graph illustrating the impedance of the battery in the low SOC area.
Figure 13:
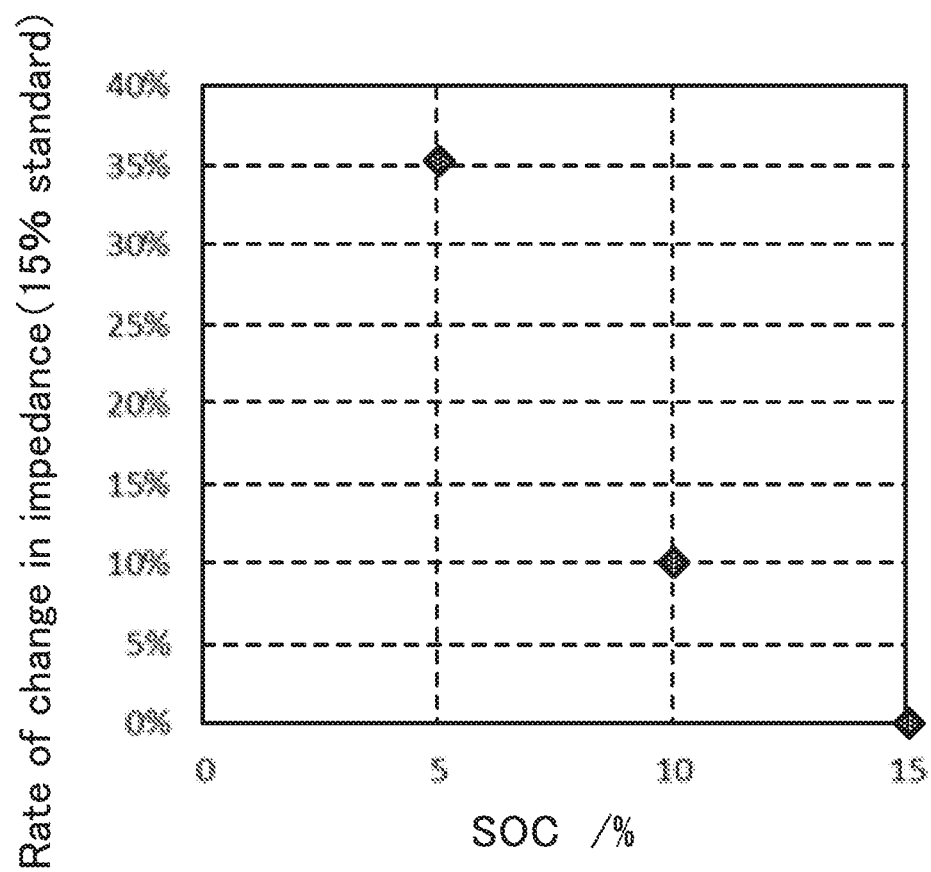
FIG. 13 is a graph illustrating a rate of change in the impedance of the battery in the low SOC area.

Hereinafter, another example of the range in which the SOC is to be estimated by using the impedance will be explained with reference to FIG. 10 to FIG. 13. FIG. 10 is a graph illustrating the voltage of the battery 10 in a low SOC area. FIG. 11 is a graph illustrating a rate of change in the voltage of the battery 10 in the low SOC area. FIG. 12 is a graph illustrating the impedance of the battery 10 in the low SOC area. FIG. 13 is a graph illustrating a rate of change in the impedance of the battery 10 in the low SOC area.

As illustrated in FIG. 10 and FIG. 11, even if the battery 10 is in a low SOC area (e.g., 0% to 15%), it can be estimated that the SOC is higher as the battery 10 has a higher voltage. Even in this case, as in the high SOC area, the rate of change in the voltage with respect to the SOC of the battery 10 is also low.

On the other hand, as illustrated in FIG. 12 and FIG. 13, the rate of change in the impedance with respect to the SOC of the battery 10 is apparently higher than the rate of change in the voltage. Thus, the SOC of the battery 10 can be accurately estimated by using the impedance even in the low SOC area.

Even if the rate of change in the impedance with respect to the SOC is not high, if a change tendency thereof is characteristic, then, the SOC can be also estimated by using the impedance.

Figure 14:
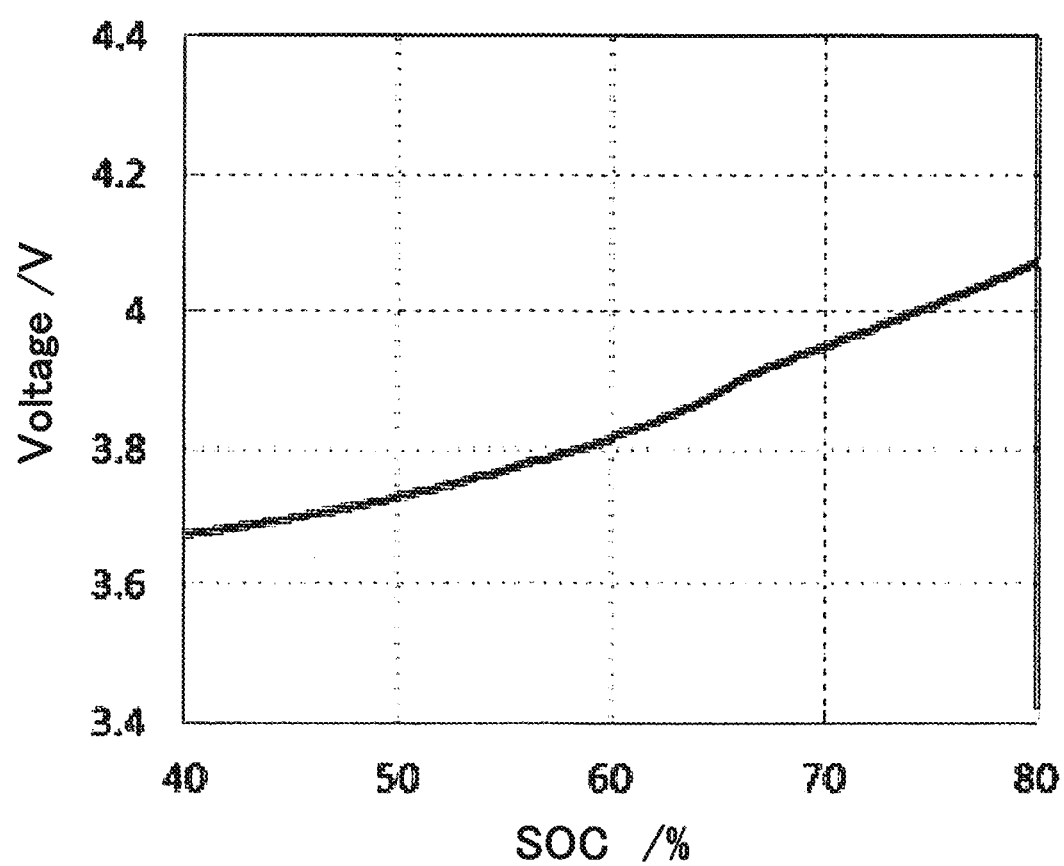
FIG. 14 is a graph illustrating a relation between a SOC and the voltage of an all solid battery.
Figure 15:
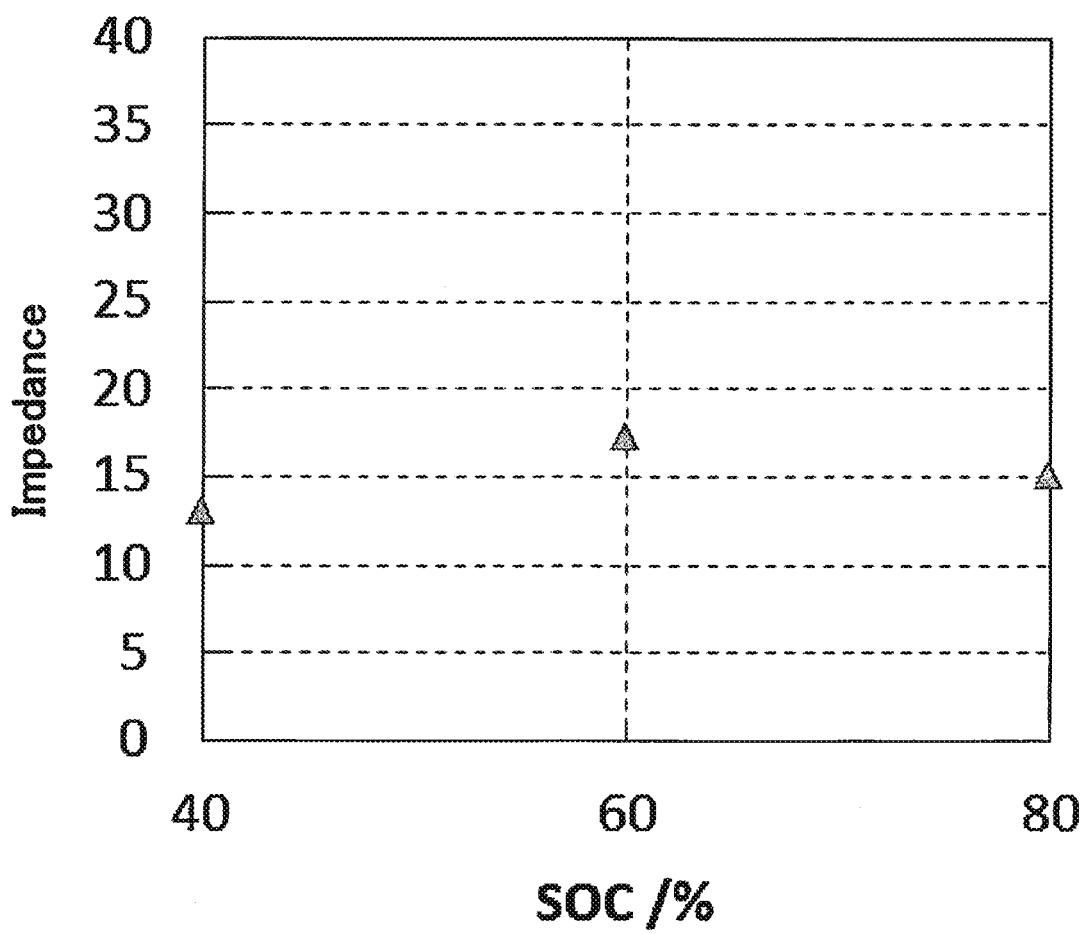
FIG. 15 is a graph illustrating a relation between the SOC and the impedance of the all solid battery.

Hereinafter, a modified example in which the SOC is estimated by using a change tendency of the impedance will be explained with reference to and FIG. 15. FIG. 14 is a graph illustrating a relation between the SOC and the voltage of an all solid battery. FIG. 15 is a graph illustrating a relation between the SOC and the impedance of the all solid battery.

As illustrated in FIG. 14, if the battery 10 is an all solid battery including lithium ions, it can be estimated that the SOC is higher as the battery 10 has a higher voltage. Even in this case, however, the rate of change in the voltage with respect to the SOC of the battery 10 is low, and it may be hard to estimate the SOC with high accuracy.

As illustrated in FIG. 15, however, the impedance of the all solid battery has a mountain shape around a SOC of 60%. This is because a state of the lithium ions inserted in a negative electrode of the battery 10 is changed around the SOC of 60%. In this case, from a time at which the impedance of the battery 10 starts to decrease from increasing, it can be estimated that the SOC is around 60%.

As described above, if the change tendency of the impedance is characteristic in a specific SOC range, the SOC of the battery 10 can be estimated by using the impedance in the characteristic SOC area.

Second Embodiment

Next, a battery state estimating apparatus according to a second embodiment will be explained. The second embodiment is partially different from the first embodiment in operation, and the other operation and apparatus configuration are substantially the same. Thus, hereinafter, a different part from that of the first embodiment explained above will be explained in detail, and an explanation of the same part will be omitted.

Explanation of Operation

Figure 16:
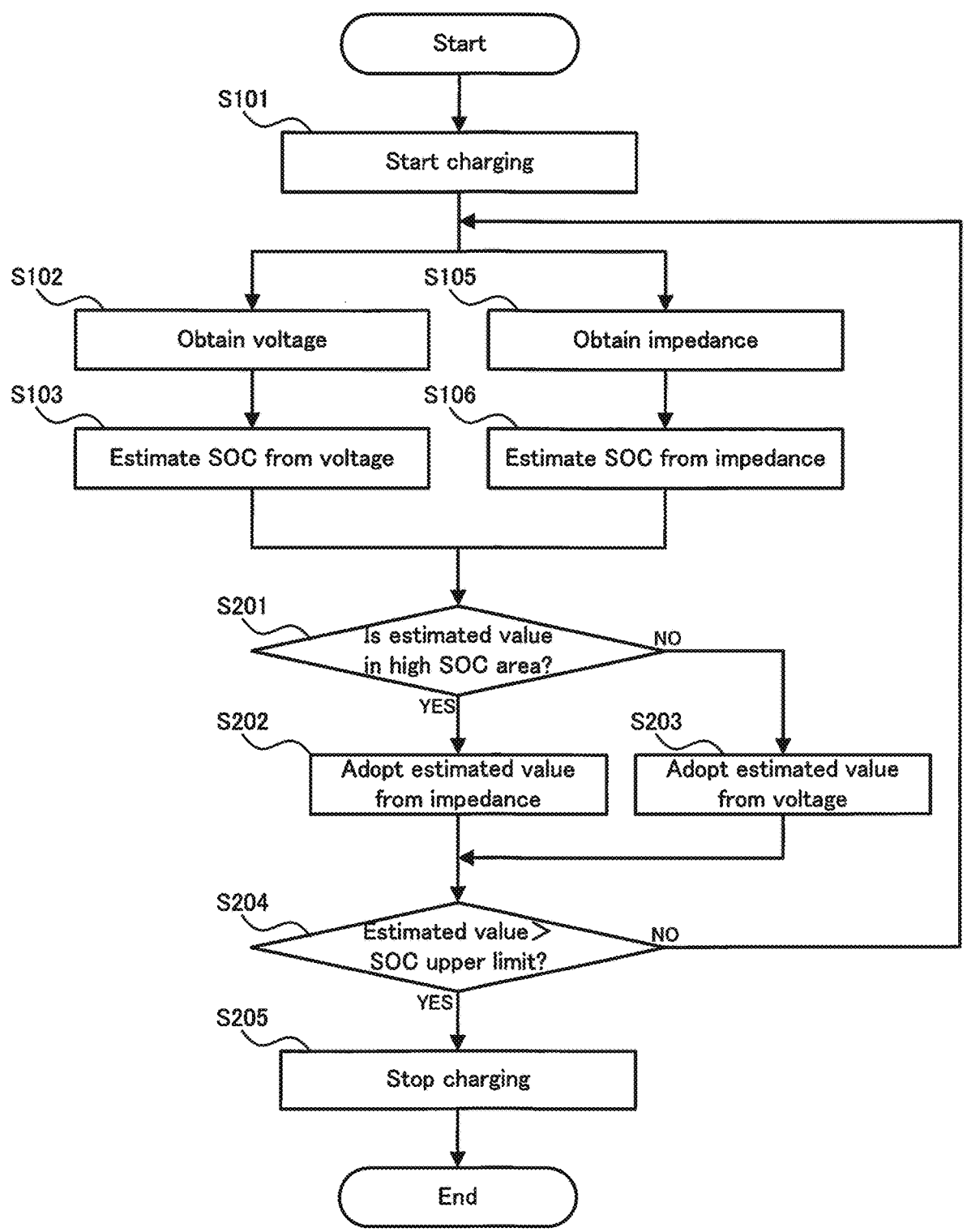
FIG. 16 is a flowchart illustrating a flow of operation of a battery state estimating apparatus according to a second embodiment.

The operation of the battery state estimating apparatus 100 according to the second embodiment will be explained with reference to FIG. 16. FIG. 16 is a flowchart illustrating a flow of the operation of the battery state estimating apparatus according to the second embodiment. In FIG. 16, the same steps as those in the first embodiment illustrated in FIG. 4 carry the same reference numerals.

As illustrated in FIG. 16, in operation of the battery state estimating apparatus 100 according to the second embodiment, if the charging of the battery 10 is started (the step S101), the voltage detector 110 obtains the voltage of the battery 10 (the step S102). Then, the first SOC estimator 130 estimates the SOC on the basis of the voltage of the battery 10 (the step S103).

On the other hand, in parallel with the steps S101 and S102, the impedance detector 120 obtains the impedance of the battery 10 (the step S105). The second SOC estimator 140 then estimates the SOC on the basis of the impedance of the battery 10 (the step S106). As described above, in the second embodiment, the estimation of the SOC by the first SOC estimator 130 (i.e., the estimation of the SOC based on the voltage) and the estimation of the SOC by the second SOC estimator 140 (i.e., the estimation of the SOC based on the impedance) are performed at the same time.

If the SOC is estimated, the SOC determinator 150 determines whether or not an estimated value of the SOC is in a predetermined high SOC area (step S201). At this time, the SOC determinator 150 may use one of the estimated value of the SOC by the first SOC estimator 130 and the estimated value of the SOC by the second SOC estimator 140. Alternatively, the SOC determinator 150 may use both of the estimated value of the SOC by the first SOC estimator 130 and the estimated value of the SOC by the second SOC estimator 140. In that case, the SOC determinator 150 may determine that the estimated value of the SOC is in the predetermined high SOC area if both of the estimated value of the SOC by the first SOC estimator 130 and the estimated value of the SOC by the second SOC estimator 140 are in the high SOC area. Alternatively, the SOC determinator 150 may determine that the estimated value of the SOC is in the predetermined high SOC area if one of the estimated value of the SOC by the first SOC estimator 130 and the estimated value of the SOC by the second SOC estimator 140 is in the high SOC area.

If it is determined that the estimated value of the SOC is in the predetermined high SOC area (the step S201: YES), the value of the SOC estimated by the second SOC estimator 140 is adopted as an official SOC estimated value of the battery 10 (step S202). In other words, in this case, the value of the SOC estimated by the first SOC estimator 130 is not adopted as the official SOC estimated value of the battery 10.

On the other hand, if it is determined that the estimated value of the SOC is not in the predetermined high SOC area (the step S201: NO), the value of the SOC estimated by the first SOC estimator 130 is adopted as the official SOC estimated value of the battery 10 (step S203). In other words, in this case, the value of the SOC estimated by the second SOC estimator 140 is not adopted as the official SOC estimated value of the battery 10.

If the estimated value of the SOC is determined, the SOC determinator 150 determines whether or not the estimated value of the SOC exceeds an upper limit value of the SOC set in advance (e.g., a value corresponding to full charge) (step S204). If it is determined that the estimated value of the SOC does not exceed the upper limit value (the step S204: NO), the process is restarted from the steps S102 and S105, and the estimation of the SOC of the battery 10 is continued. On the other hand, if it is determined that the estimated value of the SOC exceeds the upper limit value (the step S204: YES), the battery controller 160 stops the charge control of the battery 10 (step S205).

Effect of Embodiment

As explained above, the battery state estimating apparatus 100 according to the first embodiment is configured in such a manner that the estimation of the SOC by the first SOC estimator 130 (i.e., the estimation of the SOC based on the voltage) and the estimation of the SOC by the second SOC estimator 140 (i.e., the estimation of the SOC based on the impedance) are performed in parallel, and that one of the estimated value based on the voltage and the estimated value based on the impedance may be adopted depending on whether or not the estimated SOC is in the high SOC area.

If the SOC estimated value is determined in this manner, the estimation of the SOC based on the impedance is officially adopted when a temporarily estimated SOC is in the high SOC area, while the estimation of the SOC based on the voltage is officially adopted when the temporarily estimated SOC is not in the high SOC area. As a result, the SOC is estimated as in the first embodiment, and it is possible to accurately estimate the SOC of the battery even in the circumstances that there are variations in temperature and the deterioration state for the plurality of electrode bodies.

The present disclosure may be embodied in other specific forms without departing from the spirit or essential characteristics thereof. The present embodiments and examples are therefore to be considered in all respects as illustrative and not restrictive, the scope of the disclosure being indicated by the appended claims rather than by the foregoing description and all changes which come within the meaning and range of equivalency of the claims are therefore intended to be embraced therein.

What is claimed is:

1. A battery state estimating apparatus comprising:
    a voltage detector configured to detect a voltage between a positive electrode and a negative electrode of a battery having a plurality of electrode bodies, which are connected in series;
    an impedance detector configured to detect an impedance of the battery;
    a first estimator provided as a processing block configured to estimate a first temporary value of a charge amount of the battery on the basis of the voltage of the battery detected by said voltage detector;
    a second estimator provided as a processing block configured to estimate a second temporary value of the charge amount of the battery on the basis of the impedance of the battery detected by said impedance detector; and
    a determinator provided as a processing block configured (i) to determine that the first temporary value is the charge amount of the battery if the first temporary value or the second temporary value is out of a predetermined range, and (ii) to determine that the second temporary value, or a corrected value of the first temporary value, which is corrected by using the second temporary value, is the charge amount of the battery if the first temporary value or the second temporary value is within the predetermined range.

2. The battery state estimating apparatus according to claim 1, wherein the predetermined range is a range in which a rate of change in the impedance of the battery with respect to the charge amount of the battery is greater than or equal to a predetermined value, or is a range in which a change tendency of the impedance of the battery is a predetermined tendency.

3. The battery state estimating apparatus according to claim 1, wherein second estimator is configured to estimate the second temporary value only if the first temporary value is within the predetermined range.

4. The battery state estimating apparatus according to claim 1, wherein the predetermined range is a range including a charge amount at which the battery is determined to be fully charged or fully discharged.

5. The battery state estimating apparatus according to claim 1, further comprising:
    a charger configured to perform a charge control of the battery;
    a first controller programmed to control said charger to stop the charge control if the charge amount of the battery determined by said determinator is a charge amount at which the battery is determined to be fully charged, during the charge control.

6. The battery state estimating apparatus according to claim 1, further comprising:
    a discharger configured to perform a discharge control of the battery;
    a second controller programmed to control said discharger to stop the discharge control if the charge amount of the battery determined by said determinator is a charge amount at which the battery is determined to be fully discharged, during the charge control.

* * * * *